United States Patent
Yeh et al.

(10) Patent No.: US 11,226,564 B2
(45) Date of Patent: Jan. 18, 2022

(54) EUV LIGHT SOURCE AND APPARATUS FOR LITHOGRAPHY

(71) Applicant: TAIWAN SEMICONDUCTOR MANUFACTURING CO., LTD., Hsinchu (TW)

(72) Inventors: Jhan-Hong Yeh, Hsinchu (TW); Cheng-Chieh Chen, Tainan (TW); Jeng-Yann Tsay, Tainan (TW); Li-Jui Chen, Hsinchu (TW); Henry Yee Shian Tong, Hsinchu (TW); Wen-Chih Wang, New Taipei (TW); Hsin-Liang Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/405,530

(22) Filed: May 7, 2019

(65) Prior Publication Data
US 2020/0004159 A1 Jan. 2, 2020

Related U.S. Application Data

(60) Provisional application No. 62/692,281, filed on Jun. 29, 2018.

(51) Int. Cl.
*G03F 7/20* (2006.01)
*H05G 2/00* (2006.01)

(52) U.S. Cl.
CPC ...... *G03F 7/70033* (2013.01); *G03F 7/70483* (2013.01); *H05G 2/008* (2013.01)

(58) Field of Classification Search
CPC ... G03F 7/70033; G03F 7/70483; H05G 2/00; H05G 2/001; H05G 2/005; H05G 2/006; H05G 2/008
See application file for complete search history.

(56) References Cited

U.S. PATENT DOCUMENTS

| 5,175,472 A | * | 12/1992 | Johnson, Jr. ............. H05H 7/02 313/231.31 |
| 2006/0258022 A1 | * | 11/2006 | Wright .............. H01J 37/32082 438/10 |

(Continued)

FOREIGN PATENT DOCUMENTS

| CN | 1390360 A | | 1/2003 |
| CN | 108029186 A | | 5/2018 |
| TW | 399229 B | * | 7/2000 |

OTHER PUBLICATIONS

Bird Technologies, Thruline RF Power Meter Model 4421 and Thruline Directional RF Power Sensors 4020 Series, 4027A Series, 4027F Series, and 4028 Series, Operational Manual, Copyright 2015 by Bird Electric Corporation.

*Primary Examiner* — David E Smith
(74) *Attorney, Agent, or Firm* — McDermott Will & Emery LLP

(57) ABSTRACT

In a method of diagnosing an RF generator of a laser produced plasma extreme ultra violet (LPP EUV) radiation source apparatus, a testing system is connected to the RF generator of the LPP EUV radiation source apparatus. An output power is measured by the testing system with changing an input power of the RF generator. Using a computer system, the measured output power is analyzed. Based on the analyzed measured output power, whether the RF generator is operating properly is determined.

20 Claims, 15 Drawing Sheets

(56) References Cited

U.S. PATENT DOCUMENTS

2008/0237031 A1* 10/2008 Sato .................. H01J 37/32082
 204/164
2016/0172820 A1* 6/2016 Suganuma ............. H05G 2/008
 250/504 R

* cited by examiner

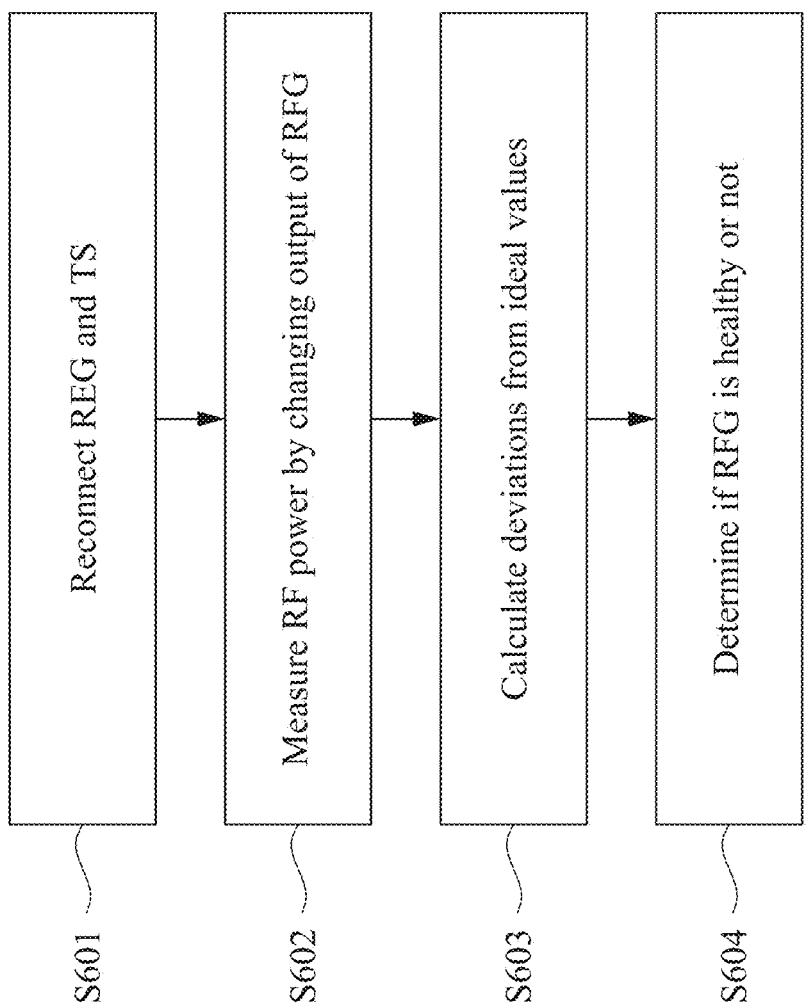

EUV LIGHT SOURCE AND APPARATUS FOR LITHOGRAPHY

RELATED APPLICATION

This application claims priority to U.S. Provisional Patent Application No. 62/692,281 filed on Jun. 29, 2018, the entire content of which is incorporated herein by reference.

BACKGROUND

This disclosure relates to pattern forming methods used in semiconductor manufacturing processes, and an apparatus for lithography.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, the need to perform higher resolution lithography processes grows. One lithography technique is extreme ultraviolet lithography (EUVL). EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by a LPP collector and reflected by optics towards a lithography target, e.g., a wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 6 shows a flow chart of a diagnosis method of an RF power generator according to embodiments of the present disclosure.

DETAILED DESCRIPTION

Figure 1A:
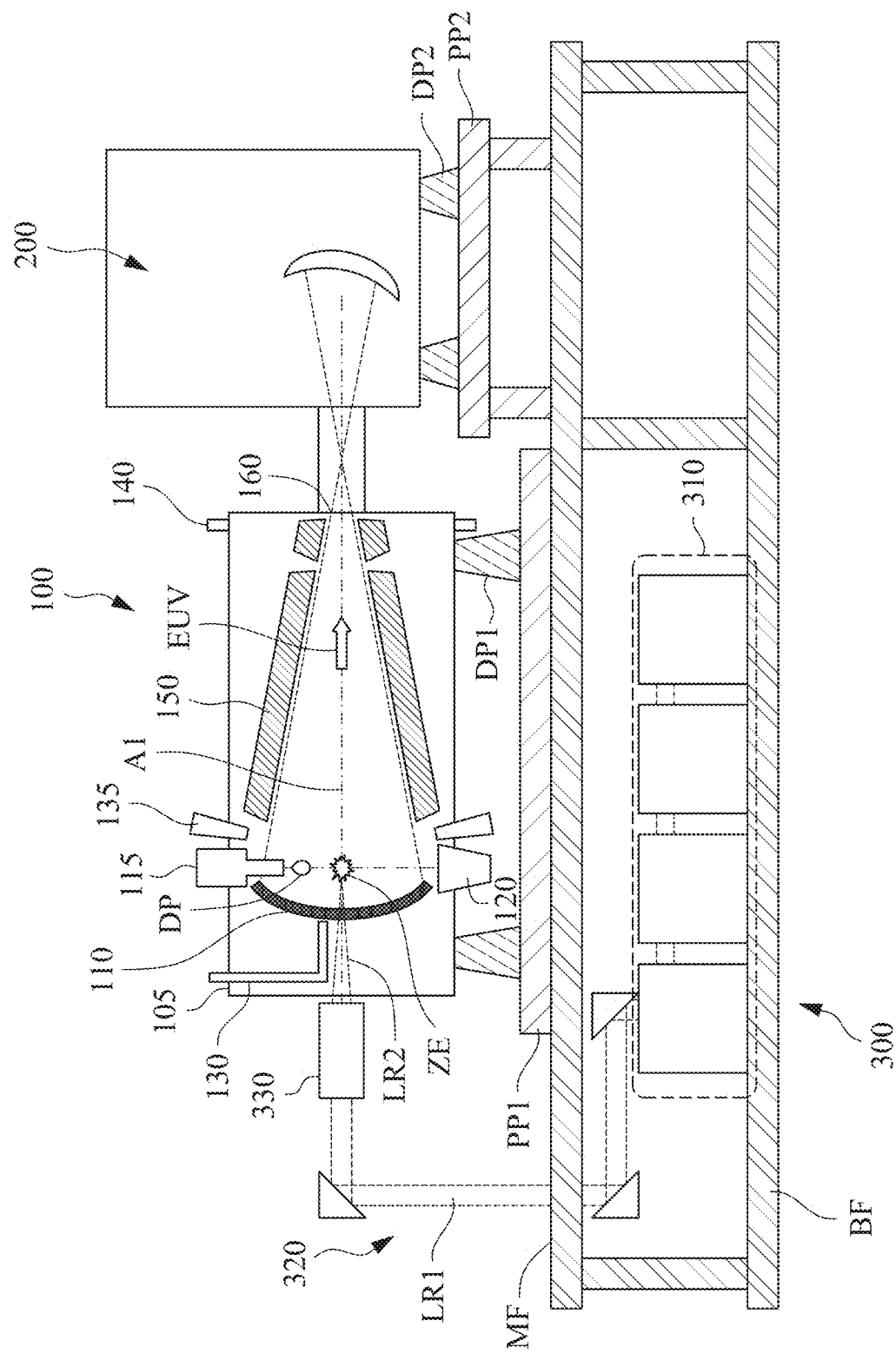
FIG. 1A is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

FIG. 1A is a schematic and diagrammatic view of an EUV lithography system. The EUV lithography system includes an EUV radiation source apparatus 100 to generate EUV light, an exposure tool 200, such as a scanner, and an excitation laser source apparatus 300. As shown in FIG. 1A, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

Figure 1B:
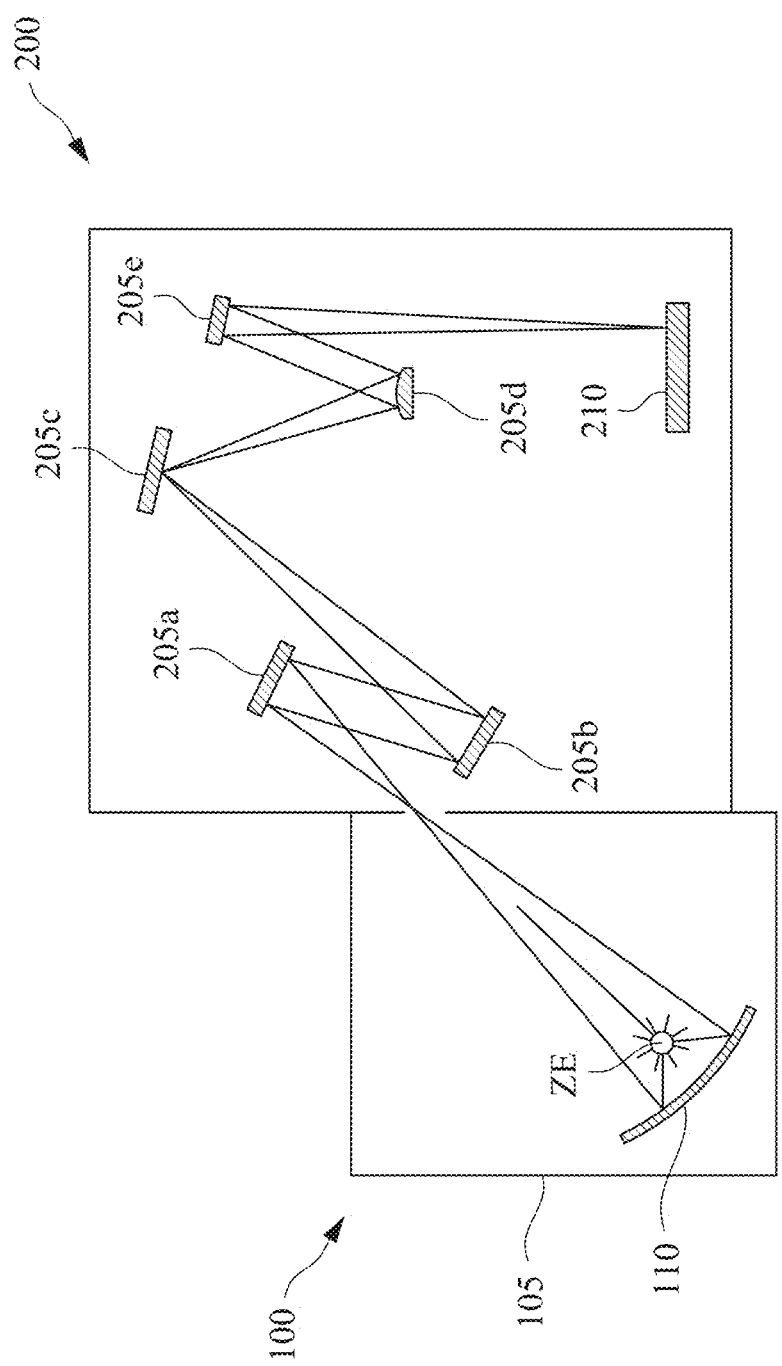
FIG. 1B is a schematic view of an EUV lithography system exposure tool according to embodiments of the disclosure.

FIG. 1B is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 1B, the EUVL tool includes an EUV light source 100 including plasma at ZE emitting EUV light in a chamber 105 that is collected and reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes. The lithography system may further include other modules or be integrated with (or be coupled with) other modules.

As shown in FIG. 1A, the EUV radiation source 100 includes a target droplet generator 115 and a LPP collector 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation laser includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 μm or less, and the main laser pulses have a spot size about 200-300 μm.

The laser pulses LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the collector mirror 110. The collector 110 has a reflection surface that reflects and focuses the EUV radiation for the lithography exposing processes. In some embodiments, a droplet catcher 120 is installed opposite the target droplet generator 115. The droplet catcher 120 is used for catching excess target droplets. For example, some target droplets may be purposely missed by the laser pulses.

The collector 110 includes a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes multiple layers (such as a plurality of Mo/Si film pairs) and may further include a capping layer (such as Ru) coated on the multiple layers to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern in some embodiments.

In such an EUV radiation source apparatus, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure tool 200.

As shown in FIG. 1A, in some embodiments, a buffer gas is supplied from a first buffer gas supply 130 through the aperture in collector 110 by which the pulse laser is delivered to the tin droplets. In some embodiments, the buffer gas is $H_2$, He, Ar, $N_2$, or another inert gas. In certain embodiments, $H_2$ is used, as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption of the EUV radiation. Hydrogen gas reaching to the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200. To trap the $SnH_4$ or other debris, one or more debris collection mechanisms or devices 150 are employed in the chamber 105.

Figure 2A:
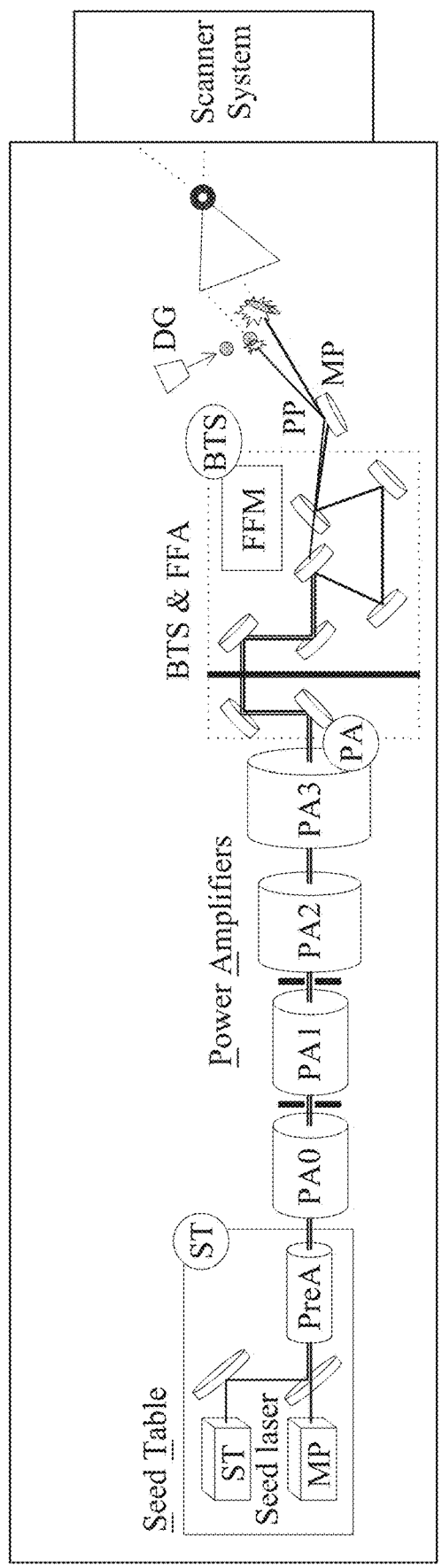
FIG. 2A is a schematic view of an EUV radiation source apparatus constructed in accordance with some embodiments of the present disclosure.

FIG. 2A shows a schematic view of laser power amplification system according to an embodiment of the present disclosure.

In some embodiments, the laser source includes a seed table ST, which includes a pre-pulse laser (pre-heat laser) source PP and main pulse layer source MP, as shown in FIG. 2A. Further, the seed table ST includes a pre-amplifier PreA that amplifies power of the pre-pulse laser PP and/or the main pulse layer MP. The laser light generated by the laser source is amplified by one or more power amplifiers PA coupled in series. The power amplifiers PA include the first to fourth power amplifiers PA0, PA1, PA2 and PA3, in some embodiments. The laser amplified by the series of power amplifiers is reflected by reflective optics disposed in a beam transport and focusing system BTS. The beam transport and focusing system BTS includes a final focus alignment system FAA and a final focus metrology FFM. The pre-pulse laser PP and/or the main pulse laser MP controlled by the beam transport and focusing system BTS hit a metal (e.g., tin) droplet generated by a droplet generator DP to produce EUV radiation. In the following embodiments, the power amplifier PA also includes the pre-amplifier PreA.

Figure 2B:
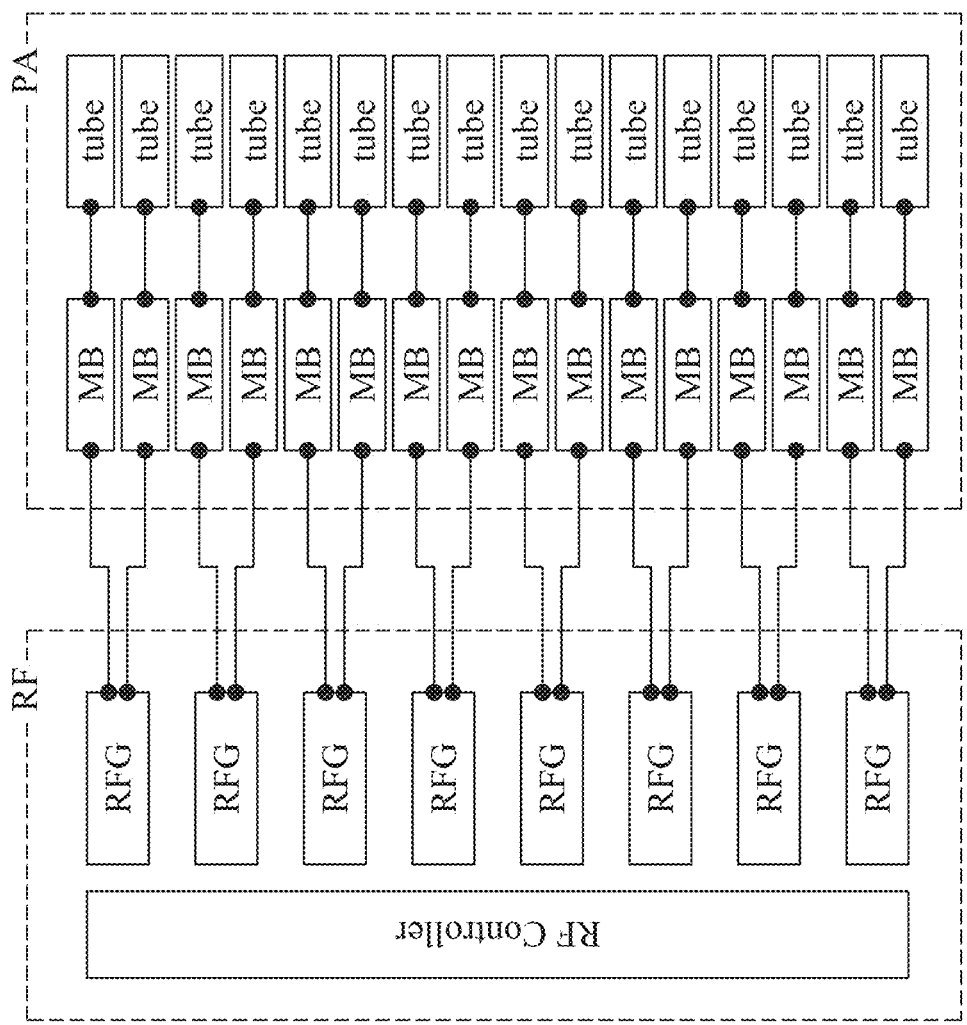
FIG. 2B shows a configuration of a laser power amplifier constructed in accordance with some embodiments of the present disclosure.

In some embodiments, as shown in FIG. 2B, each of the series of power amplifiers PA0-PA3 is driven by an RF generator RF, and includes a matching box MB and a tube coupled to the matching box MB. The matching box MB is used to minimize reflected power. In some embodiments, the matching box MB includes one or more capacitors and one or more coils (inductor), of which length can be adjusted to adjust impedance, thereby minimize the reflected power. In some embodiments, the reflected power can be limited to about less than 2% of the input power.

In some embodiments, the RF generator RF includes multiple RF generators RFG, each of which is coupled to a pair of matching boxes MB. In some embodiments, eight RF generators RFG are coupled in parallel to the power amplifier PA, which includes 16 matching boxes and 16 tubes.

Figure 3:
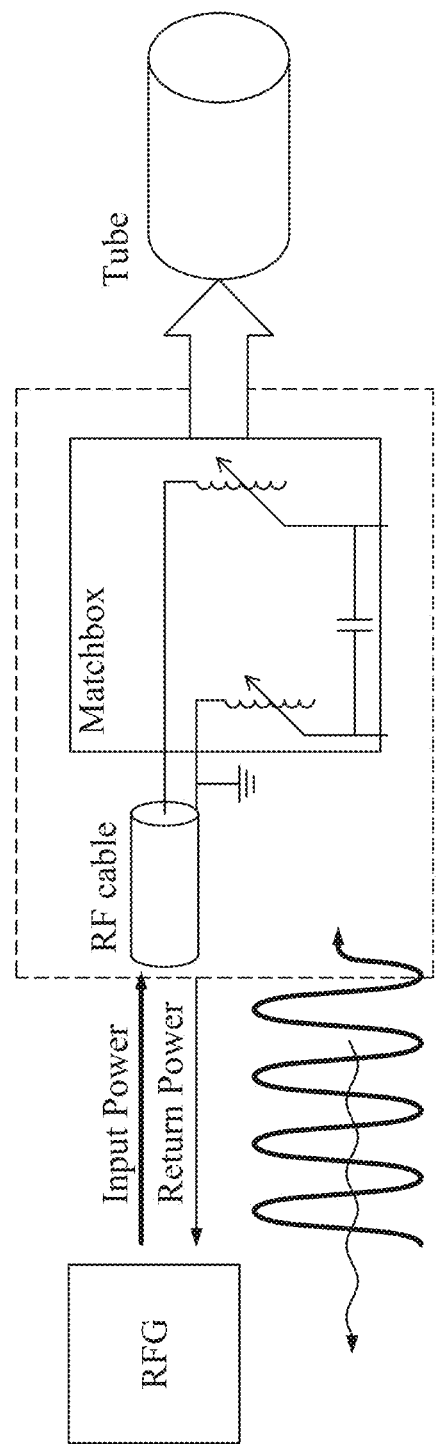
FIG. 3 shows a configuration of a laser power amplifier constructed in accordance with some embodiments of the present disclosure

As set forth above, as a high-power laser beam for laser-produced plasma (LPP), a $CO_2$ laser has been used. $CO_2$ laser power is enlarged by a consecutive power amplifier (one or more amplifiers), which uses RF power (13.56 MHz-Radio Frequency Generator) as an input. Due to its alternative power input ($P\_i$), impedance and different load (RF Cable/Matchbox), there will be return power back to the RF generator, as shown in FIG. 3. If the return Power ($P\_r$) exceeds a certain value, it may damage the RF generator and cause tool down time.

The RF return power is affected by many factors, such as an RF cable, a matchbox and/or a load. Thus, in a trouble shooting process, the following steps are performed; Step 1: check if there is a burn mark or a defect on a capacitor and/or an RF cable; Step 2: measure the resistance of matchbox; and Step 3: exchange an RF cable to identify the defects.

In the present disclosure, a new trouble shooting, error diagnosis and/or error recovery method for a faster way to diagnose a RF generator is provided.

Figure 4A:
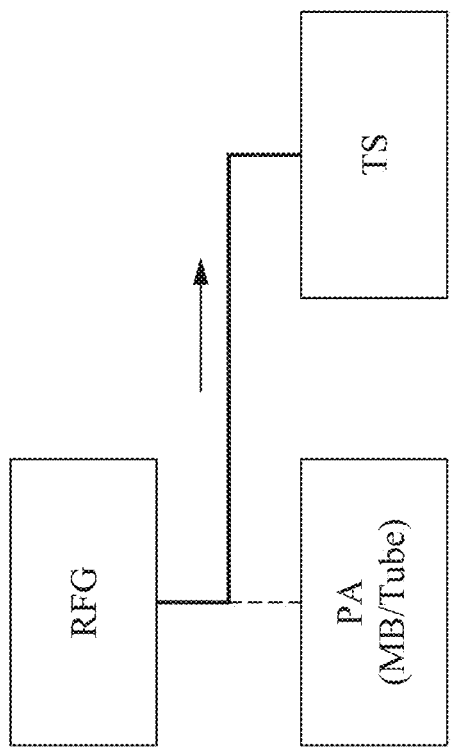
FIGS. 4A and 4B show configurations of a diagnosis method of an RF power generator according to embodiments of the present disclosure.
Figure 4B:
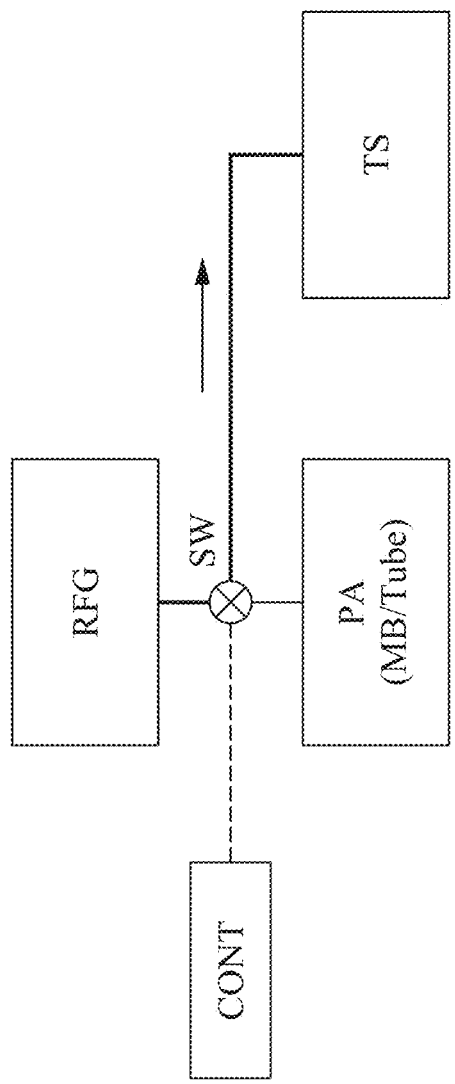

In some embodiments, as shown in FIG. 4A, to diagnose a RF generator RFG, a power cable connecting the power amplifier PA and the RF generator RFG is reconnected between the RF generator RFG and a testing system TS. In some embodiments, as shown in FIG. 4B, a switch is provided between the RF generator RFG and the power amplifier PA and/or the testing system, and to diagnose the RF generator RFG, the switch SW is turned to connect the RF generator RFG and the testing system TS. The switch SW is manually controlled in some embodiments, and is electrically controlled by a control circuit CONT in other embodiments.

Figure 5A:
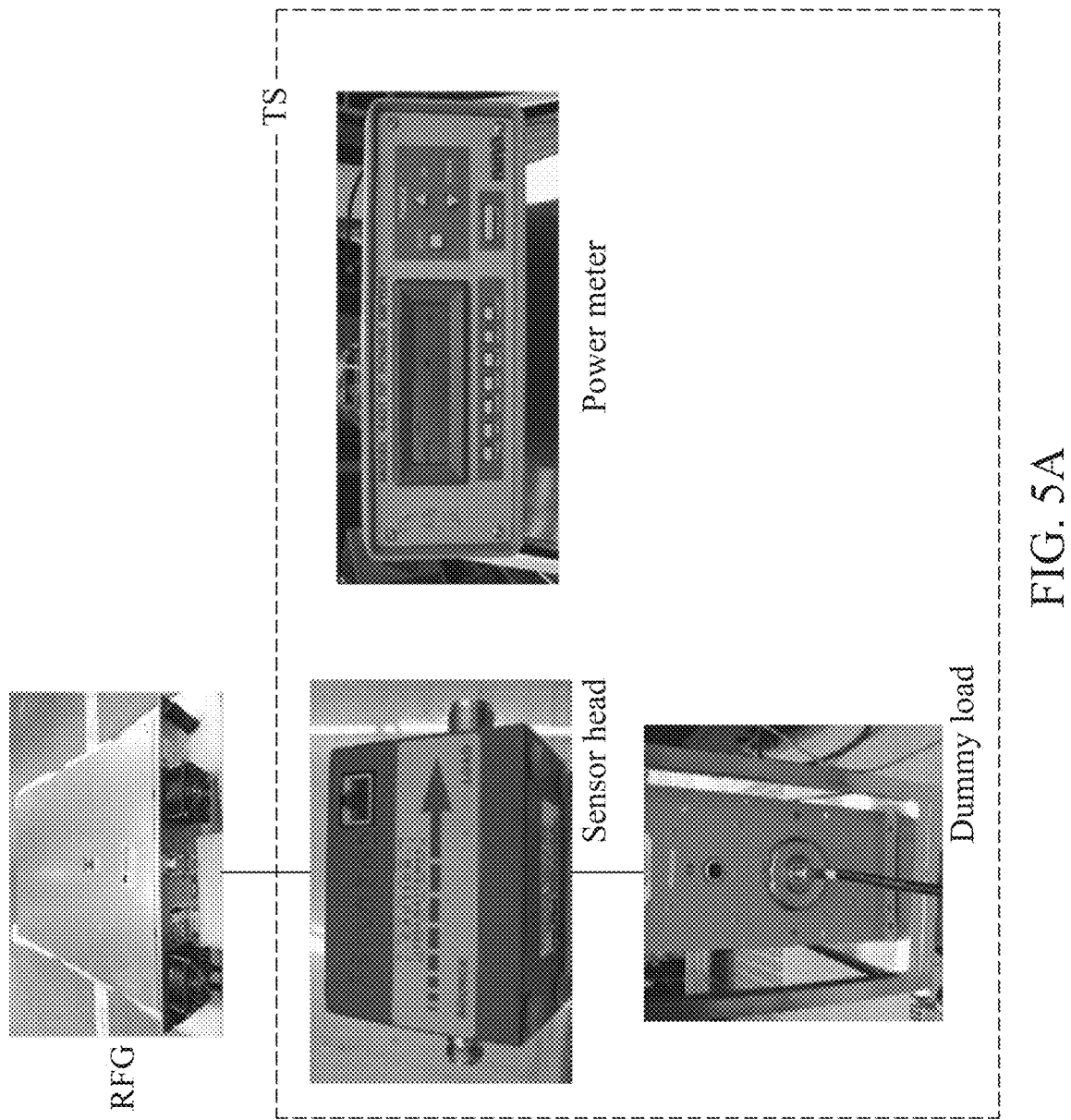
FIG. 5A shows a measurement configuration of an RF power generator according to embodiments of the present disclosure.

In some embodiments, the testing system TS includes a sensor head, a dummy load and a power meter, as shown in FIG. 5A. The sensor head is coupled to an RF cable connected to the RF generator to be tested and to the power meter.

Figure 5B:
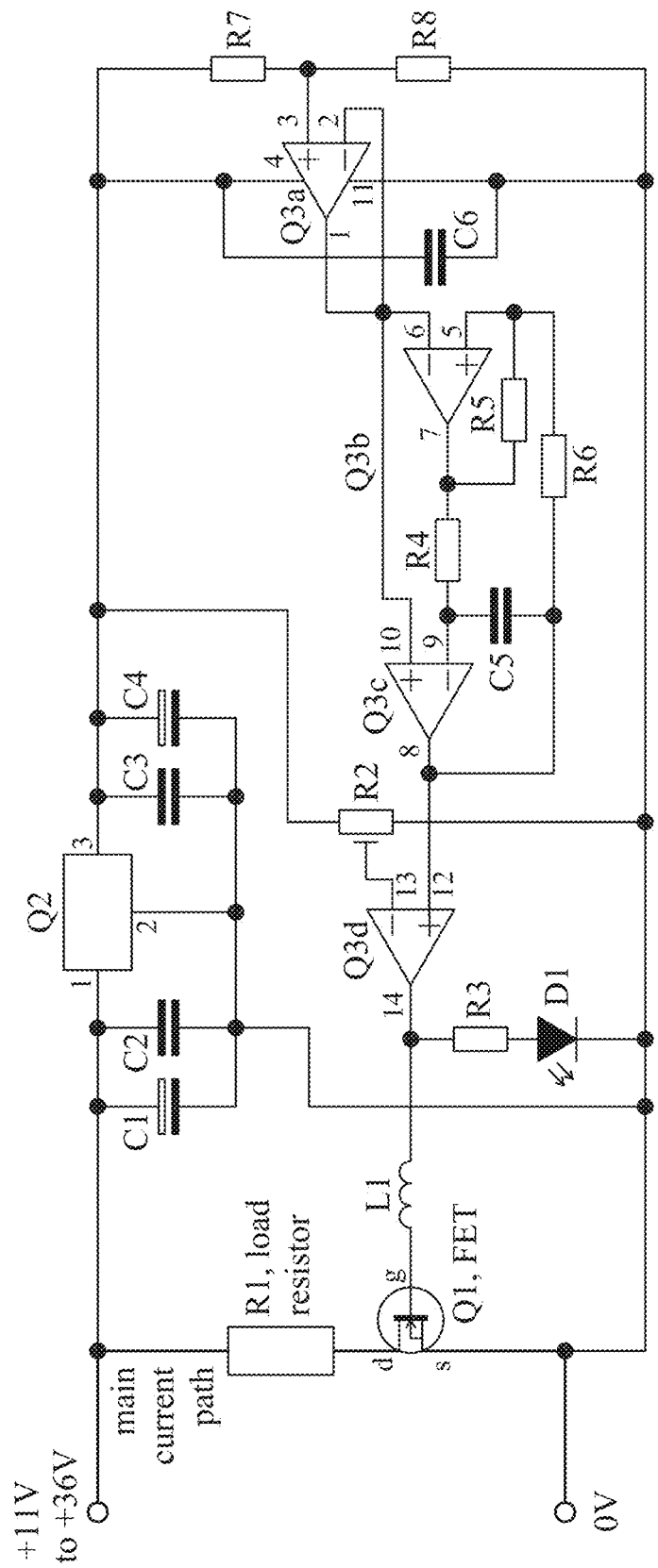
FIG. 5B shows a circuit diagram of a dummy load in the testing system.

FIG. 5B shows an example of a dummy load circuit. In some embodiments, the impedance of the dummy load R1 is in a range from about 1Ω to about 1000Ω, and is in a range from about 10Ω to about 100Ω in other embodiments. The dummy load circuit further includes capacitors C1, C2, C3, C4, C5 and C6; transistors Q1 and Q2; amplifiers Q3a, Q3b, Q3c and Q3d; a diode D1, an inductor L1 and resistors R2, R3, R4, R5, R6, R7 and R8. A frequency response of the dummy load circuit is in a range from about 400 MHz to about 2700 MHz in some embodiments. The impedance of the dummy load is adjusted to have an impedance value same as or similar to the impedance of each of the power amplifiers PA0-PA3 and PreA in other embodiments.

Commercially available devices can be employed as the sensor head and the power meter.

FIG. 6 shows a flow of diagnosing an RF generator according to an embodiment of the present disclosure.

Figure 7A:
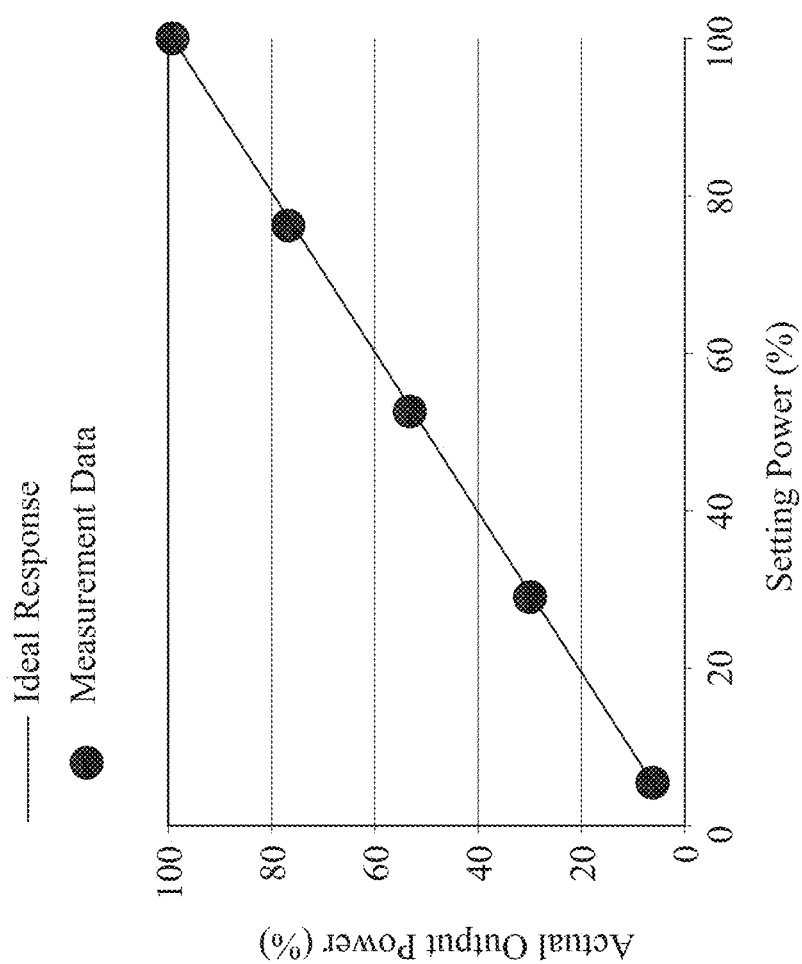
FIGS. 7A and 7B show measured results and ideal output according to embodiments of the present disclosure.
Figure 7B:
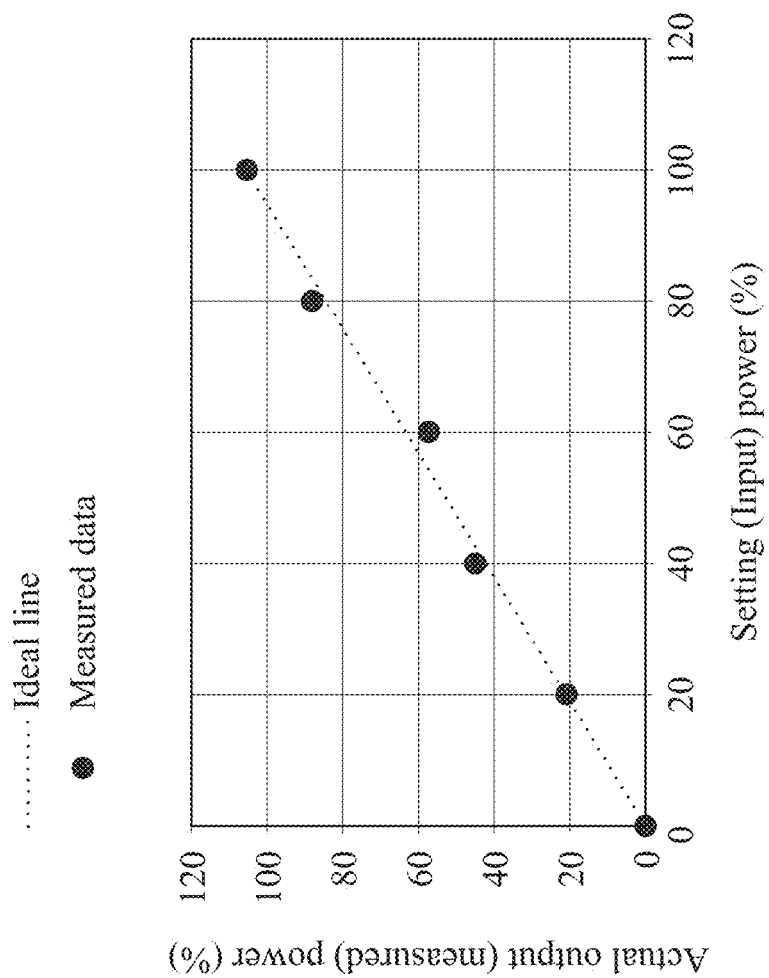

As set forth above, the RF generator RFG is disconnected from the matching box of the power amplifier and reconnected to the testing system TS including a dummy load, at S601. Then, the RF generator RFG is turned on and its input power is increased. The output power of the RF generator RFG is measured by the power meter, at S602. If the RF generator is good (healthy), the output power should be very close to the input power, or vice versa, as shown in FIG. 7A, or the measured results are liner on the input-output graph. In some embodiments, the measured data are not perfectly on the ideal line as shown in FIG. 7B. In some embodiments, more than 4 points (input power values) are measured. Up to 20 date points can be measured in some embodiments. In certain embodiments, the number of the measurement points is 5-10. According to differences between the ideal output as shown in FIG. 7A and actual output as shown in FIG. 7B, deviations from the ideal values are calculated.

In FIG. 6, the deviations from the ideal values are calculated at S603, and based on the calculated discrepancy, the condition of the RF generator is determined at S604. In some embodiments, the RF generator RFG is determined to be good when the discrepancy between the input power and the output power is within about 10% (|input−output|/input× 100) for all measured points. In other embodiments, the RF generator RFG is determined to be good when the discrepancy between the input power and the output power is within about 5% for all measured points.

In some embodiments, the measured output power values are plotted with respect to the input power and a linear approximation of the measured output power values is obtained. When the slope of the linear approximation is about 0.90 to about 1.10, the RF generator RFG is determined to be good. In other embodiments, when the slope of the linear approximation is about 0.95 to about 1.05, the RF generator RFG is determined to be good.

In other embodiments, the measured output power values are plotted with respect to the input power and a linear approximation of the measured output power values is obtained. When the $R^2$ (coefficient of determination) value of the linear approximation is equal to or more than 0.95, the RF generator RFG is determined to be good. In other embodiments, when the $R^2$ value of the linear approximation is equal to or more than 0.98, the RF generator RFG is determined to be good.

In some embodiments, the output power and the input power are individually compared in two or more ranges. In some embodiments, two linear approximations are performed for a low power range and a high power range. When the aforementioned criterion is satisfied for the both ranges, the RF generator RFG is determined to be good in some embodiments. In some embodiments, different criteria are set for different power ranges. In some embodiments, tighter criterion is set for the lower power range than the higher power range, and in other embodiments, tighter criterion is set for the higher power range than the lower power range.

The aforementioned calculations of the deviations are performed by using control circuitry or a computer system including one or more processors, which execute various programs stored in one or more memories, such as hard disk drives and semiconductor memories.

Figure 8:
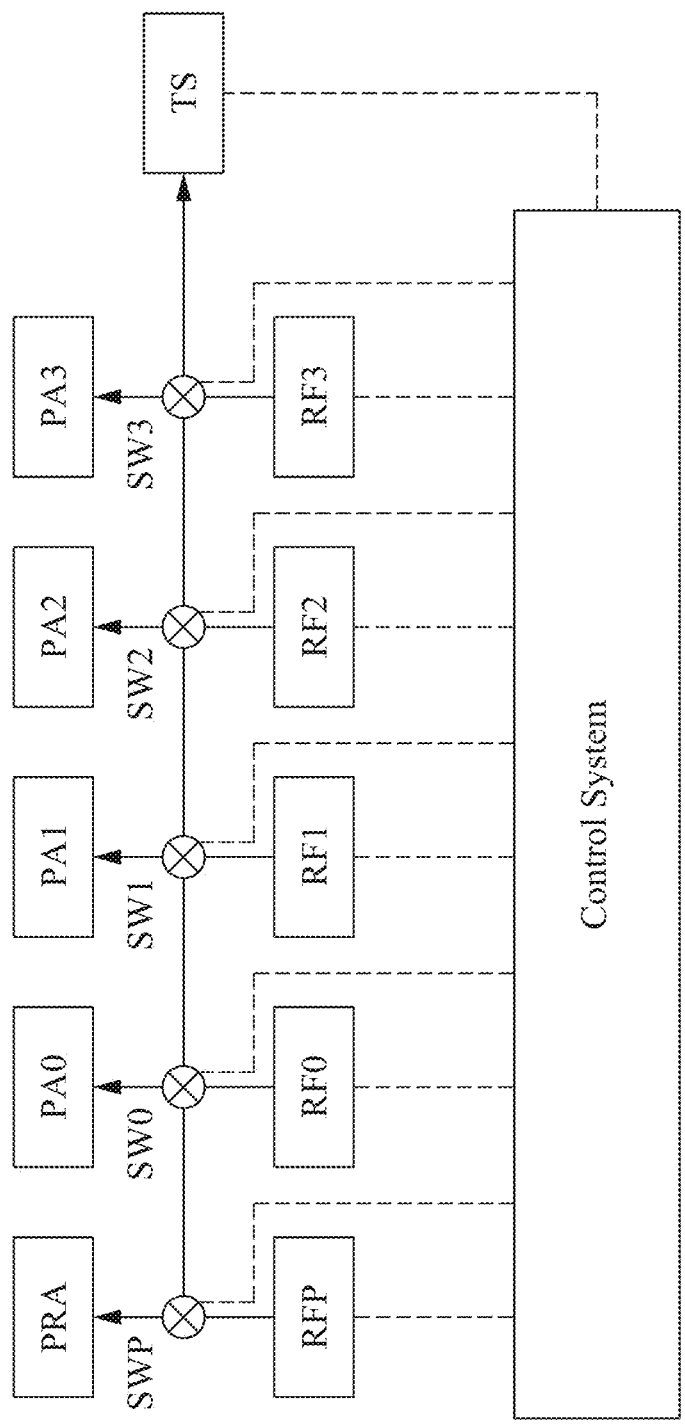
FIGS. 8, 9 and 10 show schematic views of laser power amplifiers of an EUV radiation source apparatus according to embodiments of the present disclosure.

FIG. 8 shows a configuration of the power amplifiers for pre-pulse and main pulse laser according to an embodiment of the present disclosure. Configuration, material, dimensions, process and/or operations as set forth above may be employed in the following embodiments, and detailed explanation thereof may be omitted.

As shown in FIG. 8, switches SWP, SW0, SW1, SW2 and SW3 are on RF cables connecting between amplifiers PRA, PA0, PA1, PA2 and PA3 and RF power generators RFP, RF0, RF1, RF2 and RF3, respectively. The RF power generators are coupled to an RF control system that controls on/off and adjusts power of the RF generators. In some embodiments, individual RF control systems (RF control circuit) are provided to respective RF power generators. In some embodiments, the switches are also controlled by the RF control system or a switch control circuit. In other embodiments, the switches are manually operated.

In some embodiments, by selecting one of the switches, it is possible diagnose the corresponding RF generator with the testing system TS, which is also controlled by the RF control system. In some embodiments, individual testing systems are provided to respective RF power generators. In certain embodiments, the switches and the testing system TS are controlled by a test controller (control circuit).

Figure 9:
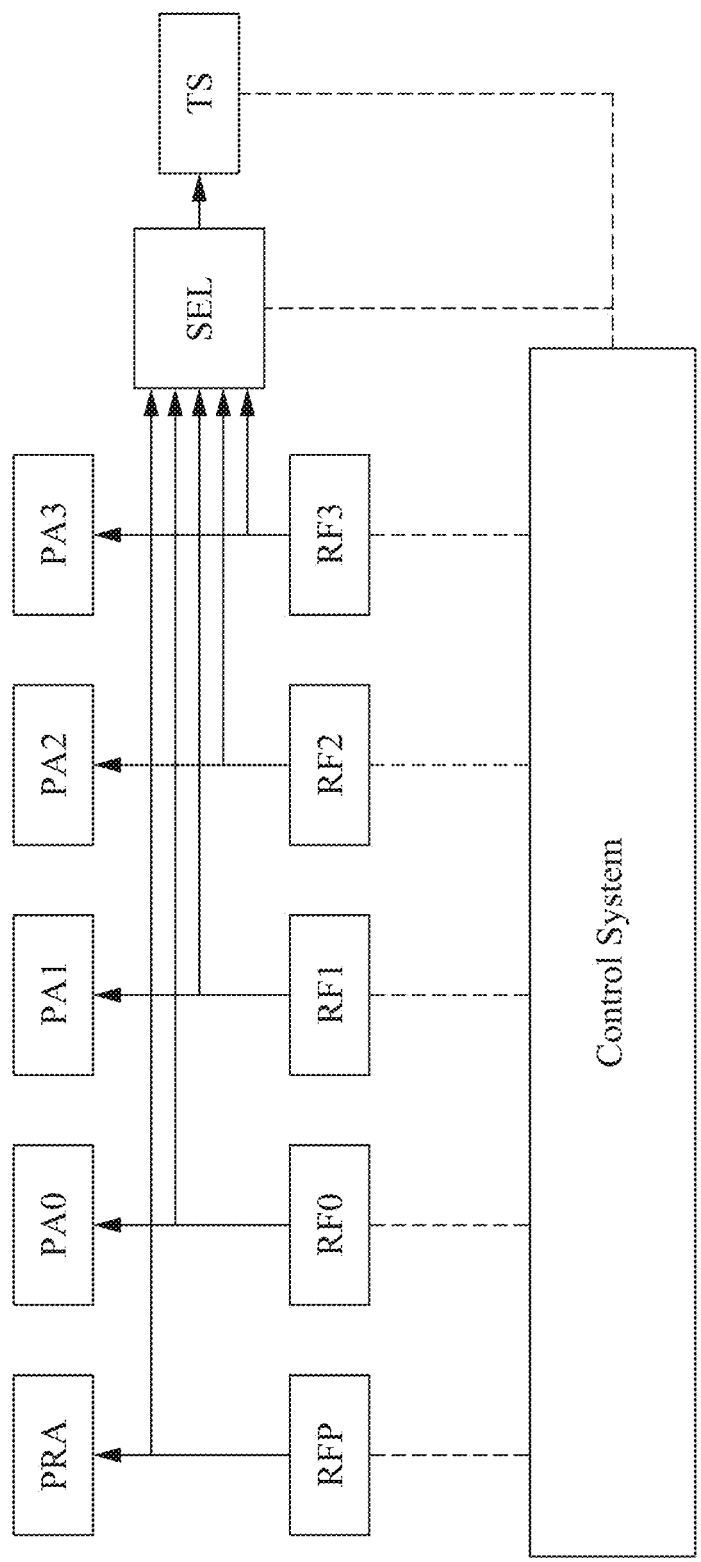

FIG. 9 shows a configuration of the power amplifiers for pre-pulse laser and main pulse laser according to an embodiment of the present disclosure. Configuration, material, dimensions, process and/or operations as set forth above may be employed in the following embodiments, and detailed explanation thereof may be omitted.

As shown in FIG. 9, a selector SEL is provided between the testing system TS and the RF generators. In some embodiments, the selector is controlled by the RF control system. In some embodiments, by selecting one of the RF cables by the selector SEL, it is possible diagnose the corresponding RF generator with the testing system TS.

Figure 10:
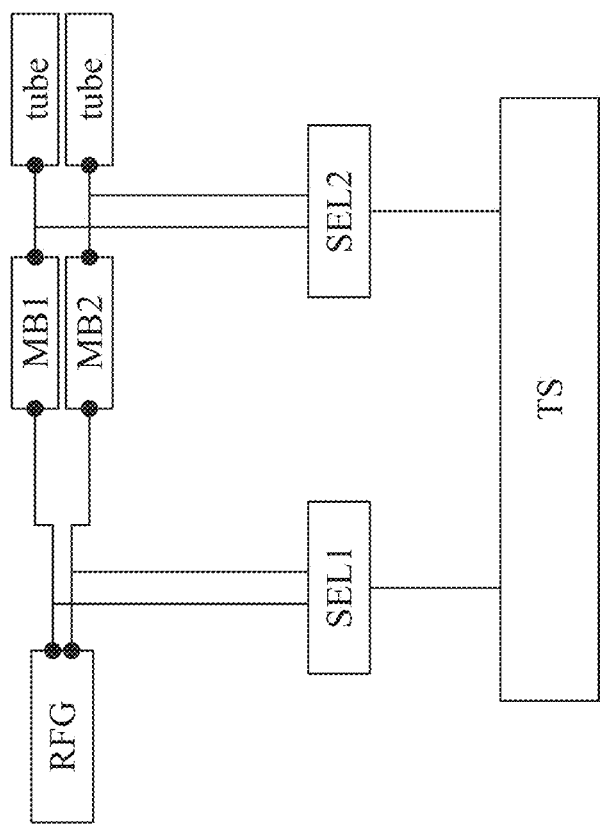

FIG. 10 shows a configuration of the power amplifiers for pre-pulse laser and main pulse laser according to an embodiment of the present disclosure. Configuration, material, dimensions, process and/or operations as set forth above may be employed in the following embodiments, and detailed explanation thereof may be omitted.

The testing system TS can be connected to a cable (e.g., RF cable) or a wire connecting between an RF generator RFG and a matching box MB1, MB2 and/or a cable (e.g., RF cable) or a wire connecting the matching box MB and a tube. In some embodiments, selector circuit SEL1 and SEL2 are disposed between the connection points and testing system TS to select a device to be tested.

In the system of FIG. 10, it is possible to diagnose not only the RF generator RFG but also the matching boxes MB1 and MB2. For example, when the RF generator is determined to be good, by measuring output power from the matching box and evaluate linearity of the output, it is possible to diagnose the condition of the matching box.

Figure 11:
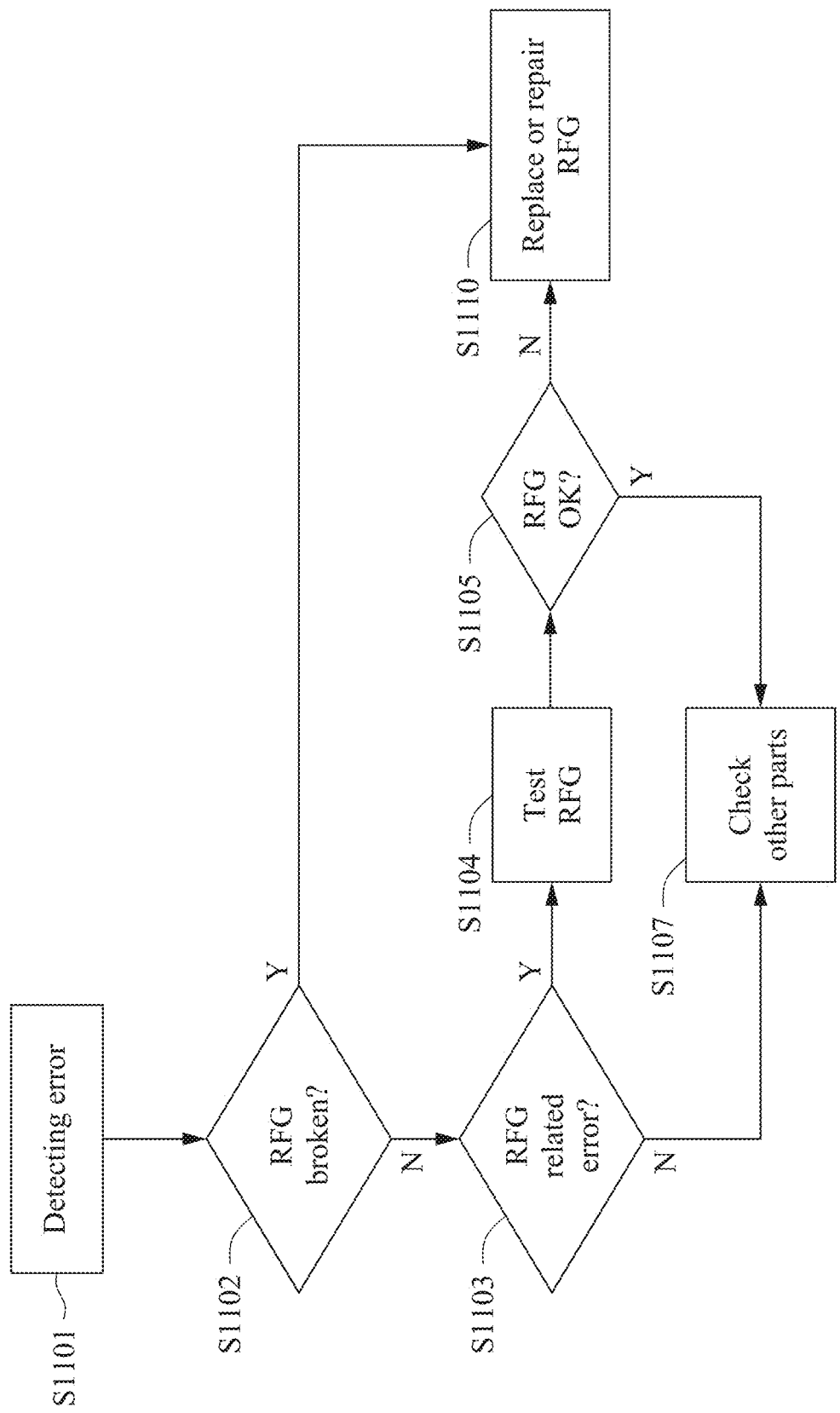
FIG. 11 shows a flow chart of a diagnosis method of an RF power generator according to embodiments of the present disclosure.

FIG. 11 show a maintenance or error recovery flow of an LPP EUV radiation source apparatus according to an embodiment of the present disclosure. Configuration, material, process and/or operations as set forth above may be employed in the following embodiments, and detailed explanation thereof may be omitted.

An LPP EUV radiation source apparatus is controlled by a controller (a control circuit) or a control system including one or more processors, which execute various programs stored in one or more memories, such as hard disk drives and semiconductor memories. In some embodiments, the LPP EUV radiation source apparatus has a self-diagnostic program to detect errors in the apparatus.

In some embodiments, as shown in S1101 of FIG. 11, the control system detects an error. In some embodiments, the control system can determine at S1102 whether specific one or more RF generators are broken or in an abnormal condition. If yes "Y" at S1102, then the identified RF generator is replaced with a new RF generator or the identified RF generator undergoes a repair work (S1110).

If at S1102 the control system does not determine ("N") that specific one or more RF generators are broken, or the system cannot identify a broken RF generator, at S1103 the control system determines whether the error is still related to RF generators and/or their related parts. If yeas "Y" in S1103, at S1104, a diagnosing process of an RF generator as set forth above using a testing system including a dummy load is performed. In some embodiments, the LPP EUV radiation source apparatus goes into an RF generator diagnosing mode, and a testing system is connected to a given RF generator to be tested by controlling a switch or a selector as shown in, for example, FIGS. 4B and 8-10.

In the diagnosing process, if one or more RG generators are found broken or in an abnormal condition ("N" at S1105), then the identified RF generator is replaced with a new RF generator or it undergoes a repair work (S1110).

If no "N" at S1103 and if yes "Y" at S1105, one or more other diagnosing processes to check parts of the EUV radiation source apparatus other than RF generators are performed (S1107). Each of the determination results and/or the next operation instruction are displayed on a display device, such as an LCD monitor, of the control system in some embodiments. In other embodiments, the operation of S1103 is performed before the operation of S1102.

It will be understood that not all advantages have been necessarily discussed herein, no particular advantage is required for all embodiments or examples, and other embodiments or examples may offer different advantages.

With the maintenance or error recovery flow shown in FIG. 11, it is possible to decrease downtime of the LPP EUV radiation source apparatus by 85% compared with a conventional maintenance or error recovery process.

In accordance with one aspect of the present disclosure, in a method of diagnosing an RF generator of a laser produced plasma extreme ultra violet (LPP EUV) radiation source apparatus, a testing system is connected to to the RF generator of the LPP EUV radiation source apparatus. An output power is measured by the testing system while changing an input power of the RF generator. Using a computer system, the measured output power is analyzed. Based on the analyzed measured output power, it is determined whether the RF generator is operating properly or not. In one or more of the foregoing or the following embodiments, in the connecting, a switch disposed between the testing system and the RF generator is operated. In one or more of the foregoing or the following embodiments, the testing system includes a dummy load, a power meter and a sensor head coupled to the dummy load and the power meter. In one or more of the foregoing or the following embodiments, multiple values of the output power are measured. In one or more of the following embodiments, in the analyzing, deviations of the multiple values of the output power from ideal output power values are calculated. In one or more of the foregoing or the following embodiments, in the analyzing, linear approximation of the multiple values of the output power is performed. In one or more of the foregoing or the following embodiments, in the determining, it is determined that the RF generator is operating properly when a slope of the linear approximation is within a predetermined range. In one or more of the foregoing or the following embodiments, in the determining, it is determined that the RF generator is operating properly when a squared remainder of the linear approximation is equal to or greater than a threshold value. In one or more of the foregoing or the following embodiments, when it is determined that the RF generator is not operating properly, the RF generator is replaced with a new RF generator. In one or more of the foregoing or the following embodiments, when it is determined that the RF generator is operating properly, the testing system is connected to a point between a matching box and a tube of the LPP EUV radiation source apparatus. An output power from the matching box is measured by the testing system with changing an input power of the RF generator. Using the computer system, the measured output power from the matching box is analyzed. Based on the analyzed measured output power, whether the matching box is operating properly is determined.

In accordance with another aspect of the present disclosure, a laser produced plasma extreme ultra violet (LPP EUV) radiation source apparatus includes a laser amplifier including a tube, a matching box and an RF generator, a testing system and a control system. The control system is configured to, when an error related to an RF generator is detected, measure an output power by the testing system while changing an input power of the RF generator, analyze the measured output power, and determine, based on the analyzed measured output power, whether the RF generator is operating properly or not. In one or more of the foregoing or the following embodiments, the control system is configured to operate a switch disposed between the testing system and the RF generator, thereby connecting the RF generator to the testing system. In one or more of the foregoing or the following embodiments, the testing system includes a dummy load, a power meter and a sensor head coupled to the dummy load and the power meter. In one or more of the foregoing or the following embodiments, multiple values of the output power are measured. In one or more of the foregoing or the following embodiments, the control system is configured to calculate deviations of the multiple values of the output power from ideal output power values. In one or more of the foregoing or the following embodiments, the control system performs linear approximation of the multiple values of the output power. In one or more of the foregoing or the following embodiments, the control system is configured to determine that the RF generator is operating properly when a slope of the linear approximation is within a predetermined range. In one or more of the foregoing or the following embodiments, the control system is configured to determine that the RF generator is operating properly when a squared remainder of the linear approximation is equal to or greater than a threshold value. In one or more of the foregoing or the following embodiments, the control system is further configured to, when it is determined that the RF generator is operating properly, connect the testing system to a point between a matching box and a tube of the LPP EUV radiation source apparatus, measure an output power from the matching box by the testing system with changing an input power of the RF generator, analyze the measured output power from the matching box, and determine, based on the analyzed measured output power, whether the matching box is operating properly or not.

In accordance with another aspect of the present disclosure, in a method of error recovery of a laser produced plasma extreme ultra violet (LPP EUV) radiation source apparatus, an error related to an RF generator in the LPP EUV radiation source apparatus is detected. It is determined whether the error indicates that the RF generator is broken. When it is determined that the error indicates that the RF generator is broken, replacement of the RF generator with a new RF generator is instructed. When it is determined that the error does not indicate that the RF generator is broken, a testing system is connected to the RF generator. An output power is measured by the testing system while changing an input power of the RF generator. Using a computer system, the measured output power is analyzed. Based on the analyzed measured output power, whether the RF generator is broken or not is determined.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of diagnosing an RF generator of a laser produced plasma extreme ultra violet (LPP EUV) radiation source apparatus, the method comprising:
    connecting a testing system to the RF generator of the LPP EUV radiation source apparatus;
    measuring an output power by the testing system while changing an input power of the RF generator;
    analyzing, using a computer system, the measured output power; and
    determining, based on the analyzed measured output power, whether the RF generator is operating properly, wherein:
    multiple values of the output power are measured,
    the analyzing comprises performing a linear approximation of the multiple values of the output power,
    the determining comprises at least one of determining that the RF generator is operating properly when a slope of the linear approximation is within a predetermined range, or determining that the RF generator is operating properly when an $R^2$ value of determination of the linear approximation is equal to or greater than a threshold value.

2. The method of claim 1, wherein the connecting comprises operating a switch disposed between the testing system and the RF generator.

3. The method of claim 1, wherein the testing system comprises a dummy load, a power meter and a sensor head coupled to the dummy load and the power meter.

4. The method of claim 1, further comprising:
    when it is determined that the RF generator is not operating properly, replacing the RF generator with a new RF generator.

5. The method of claim 4, further comprising:
    when it is determined that the RF generator is operating properly, connecting the testing system to a point between a matching box and a tube of the LPP EUV radiation source apparatus;
    measuring an output power from the matching box by the testing system with changing an input power of the RF generator;
    analyzing, using the computer system, the measured output power from the matching box; and
    determining, based on the analyzed measured output power, whether the matching box is operating properly or not.

6. A laser produced plasma extreme ultra violet (LPP EUV) radiation source apparatus comprising:
    a laser amplifier including a tube, a matching box and an RF generator;
    a testing system; and
    a control system, wherein:
    the control system is configured to, when an error related to an RF generator is detected,
        measure an output power by the testing system while changing an input power of the RF generator;
        analyze the measured output power; and
        determine, based on the analyzed measured output power, whether the RF generator is operating properly.

7. The LPP EUV radiation source apparatus of claim 6, wherein the control system is configured to operate a switch disposed between the testing system and the RF generator, thereby connecting the RF generator to the testing system.

8. The LPP EUV radiation source apparatus of claim 6, wherein the testing system comprises a dummy load, a power meter and a sensor head coupled to the dummy load and the power meter.

9. The LPP EUV radiation source apparatus of claim 6, wherein multiple values of the output power are measured.

10. The LPP EUV radiation source apparatus of claim 9, wherein the control system is configured to calculate deviations of the multiple values of the output power from ideal output power values.

11. The LPP EUV radiation source apparatus of claim 9, wherein the control system performs linear approximation of the multiple values of the output power.

12. The LPP EUV radiation source apparatus of claim 11, wherein the control system is configured to determine that the RF generator is operating properly when a slope of the linear approximation is within a predetermined range.

13. The LPP EUV radiation source apparatus of claim 11, wherein the control system is configured to determine that the RF generator is operating properly when an $R^2$ value of the linear approximation is equal to or greater than a threshold value.

14. The LPP EUV radiation source apparatus of claim 6, wherein the control system is further configured to:
    when it is determined that the RF generator is good, connect the testing system to a point between a matching box and a tube of the LPP EUV radiation source apparatus;
    measure an output power from the matching box by the testing system while changing an input power of the RF generator;
    analyze the measured output power from the matching box; and
    determine, based on the analyzed measured output power, whether the matching box is operating properly.

15. A method of error recovery of a laser produced plasma extreme ultra violet (LPP EUV) radiation source apparatus, the method comprising:

detecting an error related to an RF generator in the LPP EUV radiation source apparatus;

determining whether the error indicates that the RF generator is broken;

when it is determined that the error indicates that the RF generator is broken, instructing replacement of the RF generator with a new RF generator;

when it is determined that the error does not indicate that the RF generator is broken, connecting a testing system to the RF generator;

measuring an output power by the testing system while changing an input power of the RF generator;

analyzing, using a computer system, the measured output power; and determining, based on the analyzed measured output power, whether the RF generator is broken.

16. A method of diagnosing an RF generator of a laser produced plasma extreme ultra violet (LPP EUV) radiation source apparatus, the method comprising:

connecting a testing system to the RF generator of the LPP EUV radiation source apparatus;

measuring an output power by the testing system while changing an input power of the RF generator;

analyzing, using a computer system, the measured output power;

determining, based on the analyzed measured output power, whether the RF generator is operating properly;

when it is determined that the RF generator is not operating properly, replacing the RF generator with a new RF generator;

when it is determined that the RF generator is operating properly, connecting the testing system to a point between a matching box and a tube of the LPP EUV radiation source apparatus;

measuring an output power from the matching box by the testing system with changing an input power of the RF generator;

analyzing, using the computer system, the measured output power from the matching box; and determining, based on the analyzed measured output power, whether the matching box is operating properly or not.

17. The method of claim 16, wherein the connecting comprises operating a switch disposed between the testing system and the RF generator.

18. The method of claim 16, wherein the testing system comprises a dummy load, a power meter and a sensor head coupled to the dummy load and the power meter.

19. The method of claim 16, wherein:

multiple values of the output power are measured, and the analyzing comprises calculating deviations of the multiple values of the output power from ideal output power values.

20. The method of claim 16, wherein:

multiple values of the output power are measured, and the analyzing comprises performing a linear approximation of the multiple values of the output power.

* * * * *